United States Patent
Shao et al.

(10) Patent No.: US 11,555,640 B2
(45) Date of Patent: Jan. 17, 2023

(54) CONTROL AND SWITCH DESIGN FOR MULTIPLE PHASE CHANGE LOOPS

(71) Applicant: Baidu USA LLC, Sunnyvale, CA (US)

(72) Inventors: Shuai Shao, Sunnyvale, CA (US); Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 459 days.

(21) Appl. No.: 16/831,277

(22) Filed: Mar. 26, 2020

(65) Prior Publication Data

US 2021/0302088 A1 Sep. 30, 2021

(51) Int. Cl.
| | |
|---|---|
| *F25B 41/22* | (2021.01) |
| *F25B 49/02* | (2006.01) |
| *F28D 15/02* | (2006.01) |
| *F25B 25/00* | (2006.01) |
| *F28D 15/06* | (2006.01) |
| *F25B 41/31* | (2021.01) |

(52) U.S. Cl.
CPC ............ *F25B 49/022* (2013.01); *F25B 25/00* (2013.01); *F25B 41/22* (2021.01); *F25B 41/31* (2021.01); *F28D 15/0266* (2013.01); *F28D 15/06* (2013.01); *F25B 2600/027* (2013.01); *F25B 2600/2525* (2013.01); *F25B 2700/1931* (2013.01)

(58) Field of Classification Search
CPC .......... F25B 41/24; F25B 41/31; F25B 41/22; F25B 25/00; F28D 15/0266
See application file for complete search history.

(56) References Cited

U.S. PATENT DOCUMENTS

| | | | | |
|---|---|---|---|---|
| 6,837,063 B1 * | 1/2005 | Hood, III | ............... | G06F 1/206 |
| | | | | 165/104.21 |
| 7,061,763 B2 * | 6/2006 | Tsoi | ..................... | F25B 23/006 |
| | | | | 165/104.34 |
| 7,855,890 B2 * | 12/2010 | Kashirajima | ........... | F25B 25/00 |
| | | | | 361/699 |
| 8,392,035 B2 * | 3/2013 | Patel | ........................ | G06F 1/20 |
| | | | | 361/709 |
| 2012/0082871 A1 * | 4/2012 | Simonini | ............. | H01M 10/66 |
| | | | | 429/50 |

(Continued)

FOREIGN PATENT DOCUMENTS

| | | | | |
|---|---|---|---|---|
| CN | 109477696 A | * | 3/2019 | ............. B60K 11/02 |
| CN | 109578228 A | * | 4/2019 | |

(Continued)

*Primary Examiner* — Devon Russell
(74) *Attorney, Agent, or Firm* — Womble Bond Dickinson (US) LLP

(57) ABSTRACT

A cooling system includes an evaporator, connected through fluid lines to a first condenser, a second condenser, a compressor, and a thermal expansion valve. One or more valves are arranged in the fluid lines. The one or more valves operated to, in a first mode, circulate fluid between the evaporator the first condenser; in a second mode, circulate the fluid between a) the evaporator and the first condenser, and b) the evaporator, the second condenser, and the thermal expansion valve, and; in a third mode, circulate the fluid between a) the evaporator and the first condenser, and c) the evaporator, the compressor, the second condenser, and the thermal expansion valve.

20 Claims, 6 Drawing Sheets

(56) References Cited

U.S. PATENT DOCUMENTS

| | | | | |
|---|---|---|---|---|
| 2015/0138723 A1* | 5/2015 | Shedd | ............... | F25B 41/00 |
| | | | | 165/104.29 |
| 2019/0226723 A1* | 7/2019 | Heyl | ............... | F25B 49/02 |
| 2020/0113085 A1* | 4/2020 | Schon | ............... | F25D 17/02 |

FOREIGN PATENT DOCUMENTS

| | | | | | |
|---|---|---|---|---|---|
| IN | 201621014063 A | * | 5/2016 | | |
| WO | WO-2019087629 A1 | * | 5/2019 | ......... | B60H 1/00278 |

* cited by examiner

CONTROL AND SWITCH DESIGN FOR MULTIPLE PHASE CHANGE LOOPS

TECHNICAL FIELD

Embodiments of the present disclosure relate generally to a cooling system for information technology (IT) equipment. More particularly, embodiments of the disclosure relate to a cooling system having multiple phase change loops.

BACKGROUND

Data centers are mission critical facilities that house a large number of servers and IT equipment. Cooling systems provide a proper thermal environment for the IT equipment. It is critical to design a cooling system that provides cooling of IT equipment over a variety of heat load conditions, in an efficient and durable manner.

Phase change cooling technology tends to have good heat transfer performance while keeping the temperature low. Passive phase change cooling utilizes gravity to drive the fluid with no pump needed. Controlling a passive phase change cooling system and maintaining a steady state of a passive phase change cooling loop can be a challenge because of the inherent instability of the phase change process.

BRIEF DESCRIPTION OF THE DRAWINGS

Embodiments of the invention are illustrated by way of example and not limited in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" or "in one aspect" in various places in the specification do not necessarily all refer to the same embodiment or aspect.

Embodiments of the present disclosure address problems of existing cooling solutions, such as, for example, those mentioned above. In the present disclosure, a control and switch architecture for managing a cooling system is described. The cooling system includes multiple phase change loops that include a mix of active and passive loops.

The cooling system controls its own two-phase thermal system, and works in an energy efficient and healthy mode (e.g., precautions are taken to preserve integrity of the system and its parts). An active phase change cooling loop is integrated with a passive phase change cooling loop with pressure control for low, medium, and high heat generation source. The cooling system can use a switching scheme with a variation buffer on the controlling parameter (e.g., a pressure threshold) to ensure that the cooling system (including a compressor) works in an energy efficient way, while also improving the stability and reliability of the system.

Figure 1:
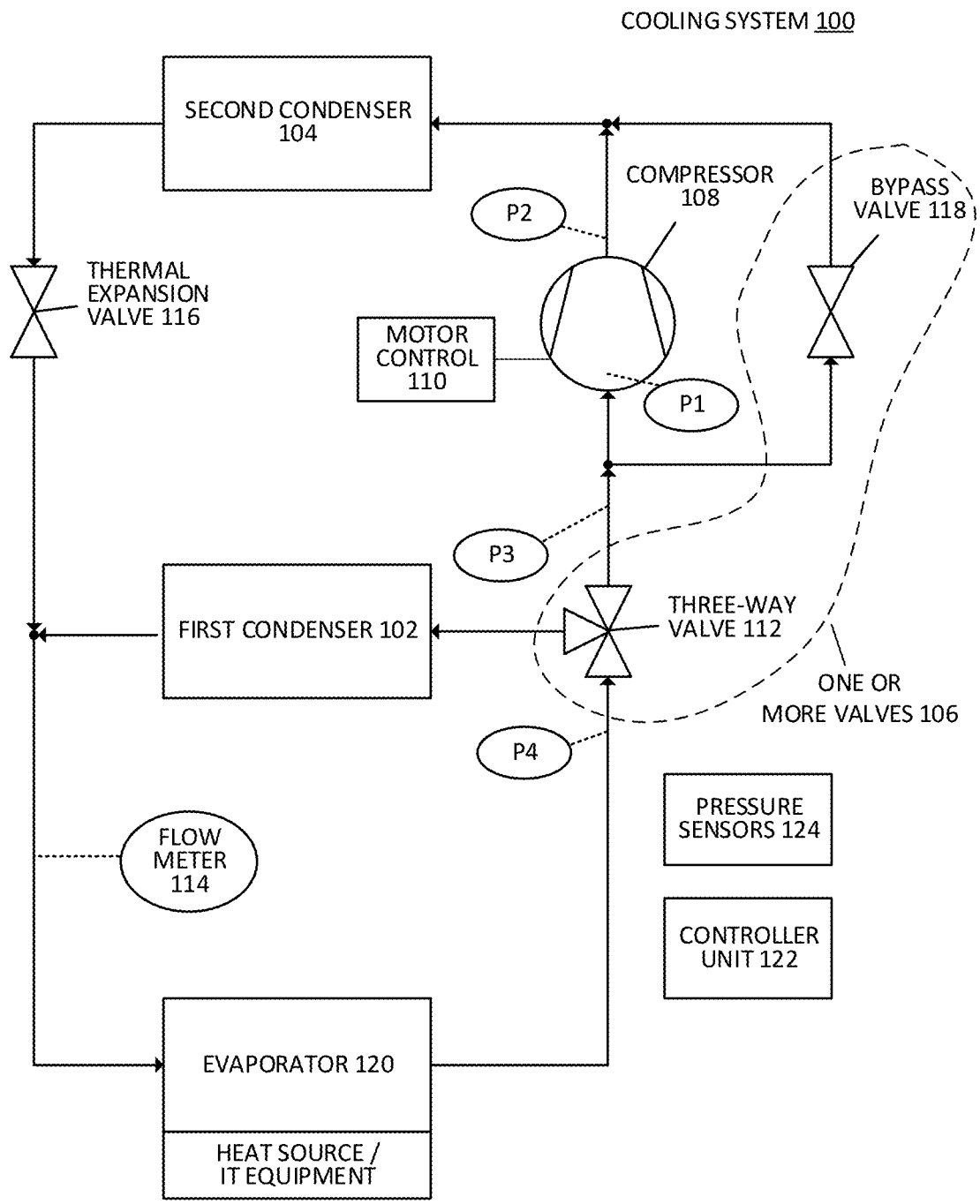
FIG. 1 shows a cooling system with more than one phase change loop, according to one embodiment.

According to one embodiment, as shown in FIG. 1, a cooling system 100 includes an evaporator 120, connected through fluid lines to a first condenser 102, a second condenser 104, a compressor 108, and a thermal expansion valve 116. One or more valves 106 are arranged in the fluid lines to coordinate fluid flow from the evaporator to the condensers and the compressor. The one or more valves are operated to, in a first mode (a 'passive mode'), circulate fluid between the evaporator the first condenser. Flow to the compressor and the second condenser is restricted in this mode.

The evaporator and the first condenser can form a thermosiphon loop that circulates between the evaporator and the first condenser passively, without use of a motor/pump. In such a case, the fluid in the cooling system is vaporized in the evaporator. The vaporized fluid flows to the first condenser based on natural convection—utilizing thermal expansion to create a density difference across the loop. The vaporized fluid floats from the evaporator to the first condenser. The cooler fluid will sink from the first condenser back to the evaporator. Thus, the fluid is circulated without a pump, while transferring thermal energy away from a heat source (e.g., IT equipment). This allows the cooling system to work passively when less thermal transfer is required.

In a second mode (a 'transition mode'), the one or more valves are operated to circulate the fluid between a) the evaporator and the first condenser, and b) the evaporator, the second condenser, and the thermal expansion valve. Similar to the first mode, this second mode does not use a motor/pump. In both the first mode and the second mode, the thermal expansion valve is controlled to maintain no pressure drop across the thermal expansion valve 116—no pressure is released in these modes by the thermal expansion valve.

In a third mode (an 'extreme mode'), the one or more valves are operated to circulate the fluid between a) the evaporator and the first condenser, and c) the evaporator, the compressor, the second condenser, and the thermal expansion valve. In this mode, the compressor 108 and its motor/pump is turned on by motor controller 110. The compressor greatly increases the pressure and temperature of the fluid through compression. There is not a significant phase change from the inlet to the outlet of the compressor. Due to the threshold temperature required to enter the third mode, all the coolant in the compressor should be vapor (gas). The second condenser then extracts significant amounts of this thermal energy from the fluid, converting some if not all of the vaporized fluid to liquid form. In the third mode, due to the active compression and increased circulation of the fluid, more thermal energy is extracted at the second condenser than in the other modes. In some embodiments, the compressor is an adjustable compressor. Frequency of the compressor can be adjusted, e.g., by the motor control and/or controller, to provide varying cooling capabilities. At higher frequencies, the cooling system is capable of extracting greater thermal energy from a heat source.

In this third mode, the thermal expansion valve 116 is controlled to reduce the pressure and temperature of the fluid (e.g., a coolant) greatly. There is no phase change from its inlet to the outlet. All the coolant is liquid. The pressure difference over the thermal expansion valve can be controlled, (e.g., by a controller unit, with a control command). As discussed, when the compressor is not working (e.g., bypassed in the first and second mode), there is no pressure difference before and after the thermal expansion valve, by control. When compressor is working, the temperature and pressure of the fluid are reduced at the outlet of the thermal expansion valve. In the third mode, the controller determines how much to reduce the pressure (e.g., 'reduce pressure X amount') and can control this reduction to varying amounts of pressure by an analog or digital control command. The reduction command can be determined based on the pressure at P4.

The system includes pressure sensors 124 that are arranged in the cooling system to measure pressure in the fluid lines at locations P1, P2, P3, and P4. One or more pressure sensors inside the compressor 108 sense pressure P1, thereby monitoring the working status of the compressor—to determine whether or not the compressor is compressing fluid. Pressure sensors P3 and P2 sense pressure at the inlet and outlet of the compressor, monitoring the suction pressure and discharge pressure of the compressor. P1 monitors the pressure inside the compressor. If one or more of pressures P1, P2, or P3 is too low (e.g., below a threshold pressure), this indicates that the compressor is not working properly and/or there is too much liquid in the compressor. Under this condition, the control unit and/or the motor control can stop the compressor from running, to prevent damage to the compressor and/or the cooling system. The motor control can be implemented as a combination of hardware (e.g., programmable logic, electronic circuits, electrical switches and relays, and/or processors) and software (instructions stored in machine readable memory), A pressure sensor measures an outlet pressure of the evaporator P4, e.g., on one side of the three-way valve. This pressure can be used by the cooling system to monitor the coolant flowing out of the evaporator.

When the cooling system operates in the third mode, the fluid can be measured at or prior to the inlet of the evaporator, or between the evaporator and the thermal expansion valve. The measurement indicates an amount of the fluid that is in vapor form. This amount can be described as a percentage, ratio, or volume. This measurement can be performed with a flow meter 114 or the cooling system. The flow meter can be an ultrasound flow meter that produces one or more signals that indicate how much of the fluid is in vapor form. The vapor measurement can be performed with other equivalent technology. Based on the measurement that indicates an amount of the fluid that is in vapor form at an inlet of the evaporator, the one or more valves are operated to increase the fluid circulation from the evaporator to the compressor, and the second condenser (i.e. through the extreme mode loop).

It should be understood that each of the evaporator, the condensers, and the valves have inlets and outlets. Inlets are shown with arrows of the fluid lines pointing into the respective component, while outlets are shown with arrows of the fluid lines pointing out of the respective component. The condensers of any of the cooling system embodiments can be liquid cooled or air cooled condensers. Fluid in the fluid lines can be a coolant (e.g., water, glycol, etc.) that can be in liquid or vapor (gas) form.

The cooling system transitions between the first mode, the second mode, and the third mode automatically, based on pressure P4, which can be described as the pressure in the fluid line at the outlet of the evaporator. A controller unit 122 can monitor the pressure P1-P4 and control each of the one or more valves 106 in a coordinated manner to direct and restrict fluid circulation as described by the first, second, and third mode. The controller unit 122 can include one or more processors that perform programmed instructions stored on machine-readable medium. Additionally, or alternatively, the controller unit can include electronic hardware logic such as field programmable gate arrays (FPGAs), complex programmable logic devices (CPLDs), or other equivalent technologies. The controller unit can be integrated into one or more of the valves, packaged separately as a standalone device, and/or a combination of multiple devices.

The one or more valves can be electro-mechanically controlled by the controller unit. For example, a valve can have an actuator (e.g., solenoid and magnetically attractable members) that cause the valve to open and close when activated and deactivated. Additionally, or alternatively, valves can include a step motor or other equivalent technology. The controller unit can also communicate with the motor control 110 to command the motor control to turn the compressor on or off.

Open ratios of the valves can also be controlled, e.g., proportionate to a command given by the controller unit. For example, when the flow meter 114 shows that vapor at the inlet of the evaporator is above a threshold amount, the controller can command the one or more valves to be 'open X %'. The valve responds by opening to X %, thereby increasing fluid circulation to the compressor (assuming that the compressor is not bypassed). When the vapor amount is reduced, the opening of the valve can similarly be commanded to be smaller, e.g., 'open Y %'. The one or more valves can, in this manner, control fluid circulation to the compressor in the third mode. The command can be proportionate to the amount of fluid in vapor form that is sensed at the inlet of the evaporator.

In some embodiments, the one or more valves includes a three-way valve 112 that is operated to fluidly connect the evaporator to only the first condenser in the first mode. The three-way valve can be operated to, in the first mode, restrict fluid circulation to the first loop (the passive loop). In this first loop, fluid circulates from the evaporator to the first condenser, and then back to the evaporator.

In the second mode the three-way valve is operated to still circulate fluid to the first loop, but also allows fluid flow through the second loop (the transition loop). In this loop, the fluid circulates from the evaporator to the bypass valve to the second compressor to the thermal expansion valve and back to the evaporator. As such, in this mode, the bypass valve is operated to be open.

In the third mode, the three-way valve is operated to allow fluid flow in the first loop and also to the compressor 108. The one or more valves can include a bypass valve 118 that is fluidly connected in parallel with the compressor and in series with the second condenser. In the third mode, the bypass valve can be operated to close, which forces fluid circulation through the third loop (the extreme loop). In this loop fluid circulates from the evaporator to the compressor to the second condenser to the thermal expansion valve and back to the evaporator. In all three modes, fluid flows through the first loop.

In such a manner as described with respect to FIG. 1, the cooling system has an active phase change cooling (the extreme loop) integrated with passive phase change cooling (the passive loop and transition loop). Circulation in these loops is controlled through pressure, to accommodate low and high heat generation sources, under different thermal conditions.

Figure 2:
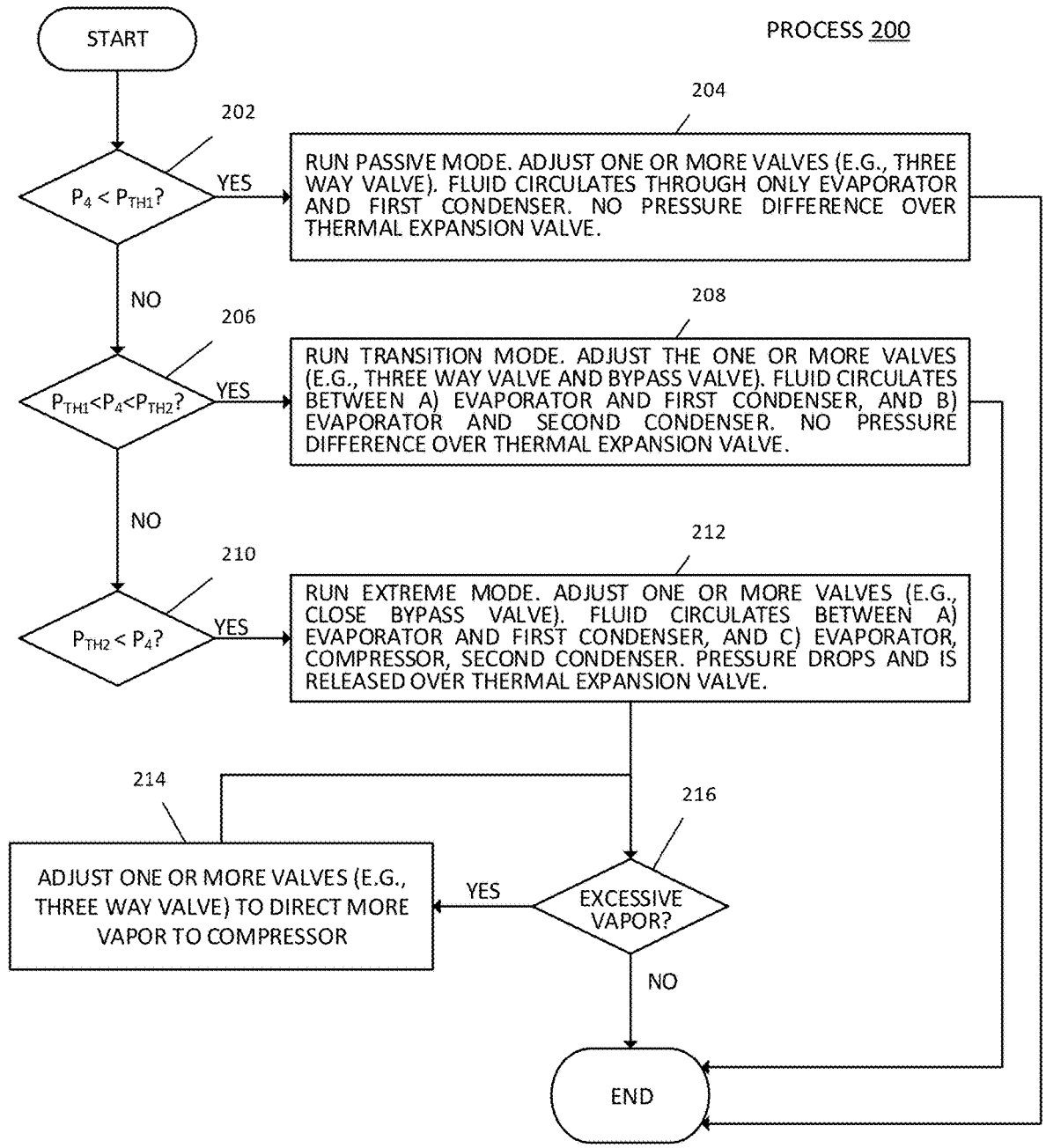
FIG. 2 shows a process for controlling a cooling system, according to one embodiment.
Figure 4:
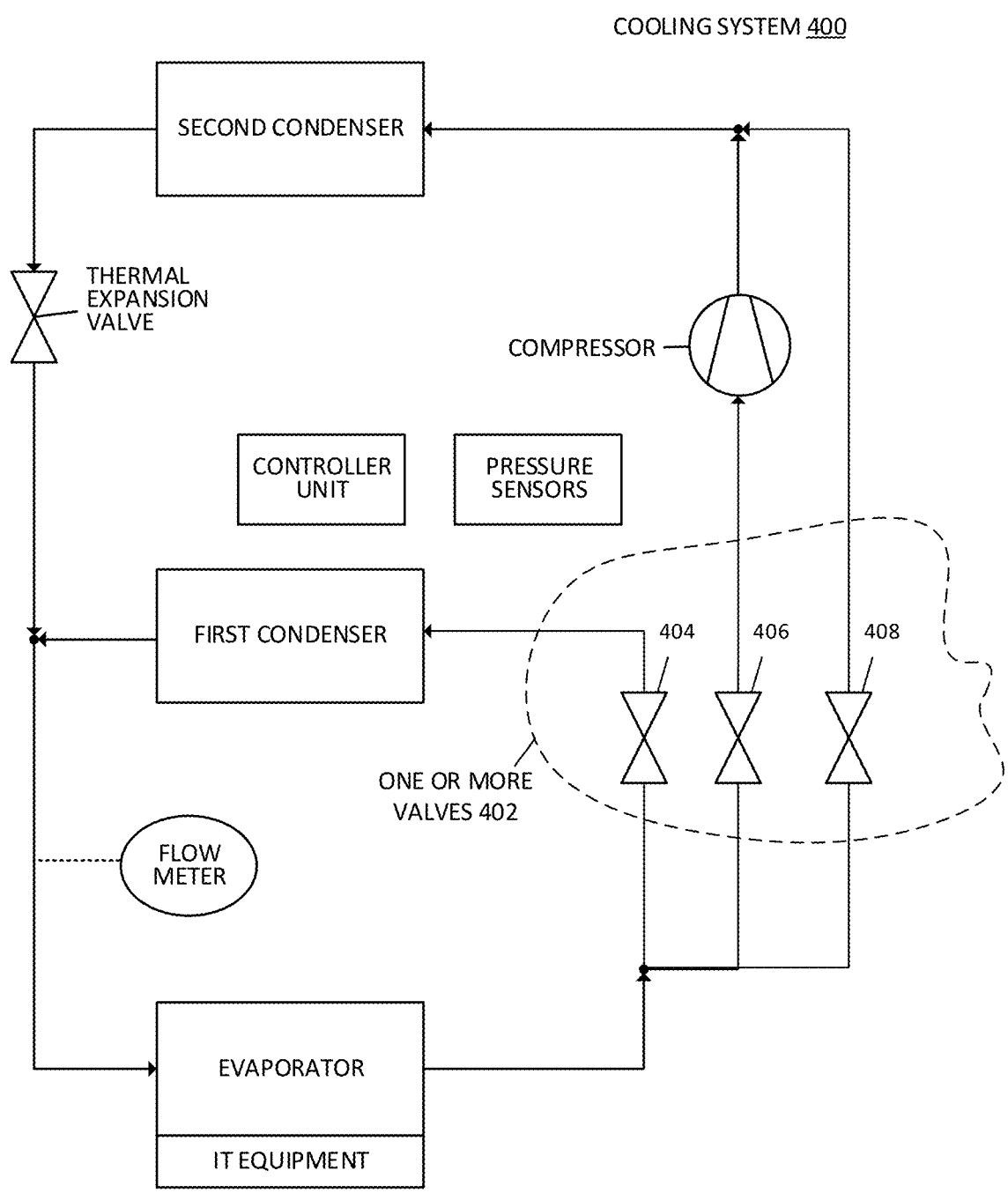
FIG. 4 shows a cooling system with more than one phase change loop, according to one embodiment.
Figure 5:
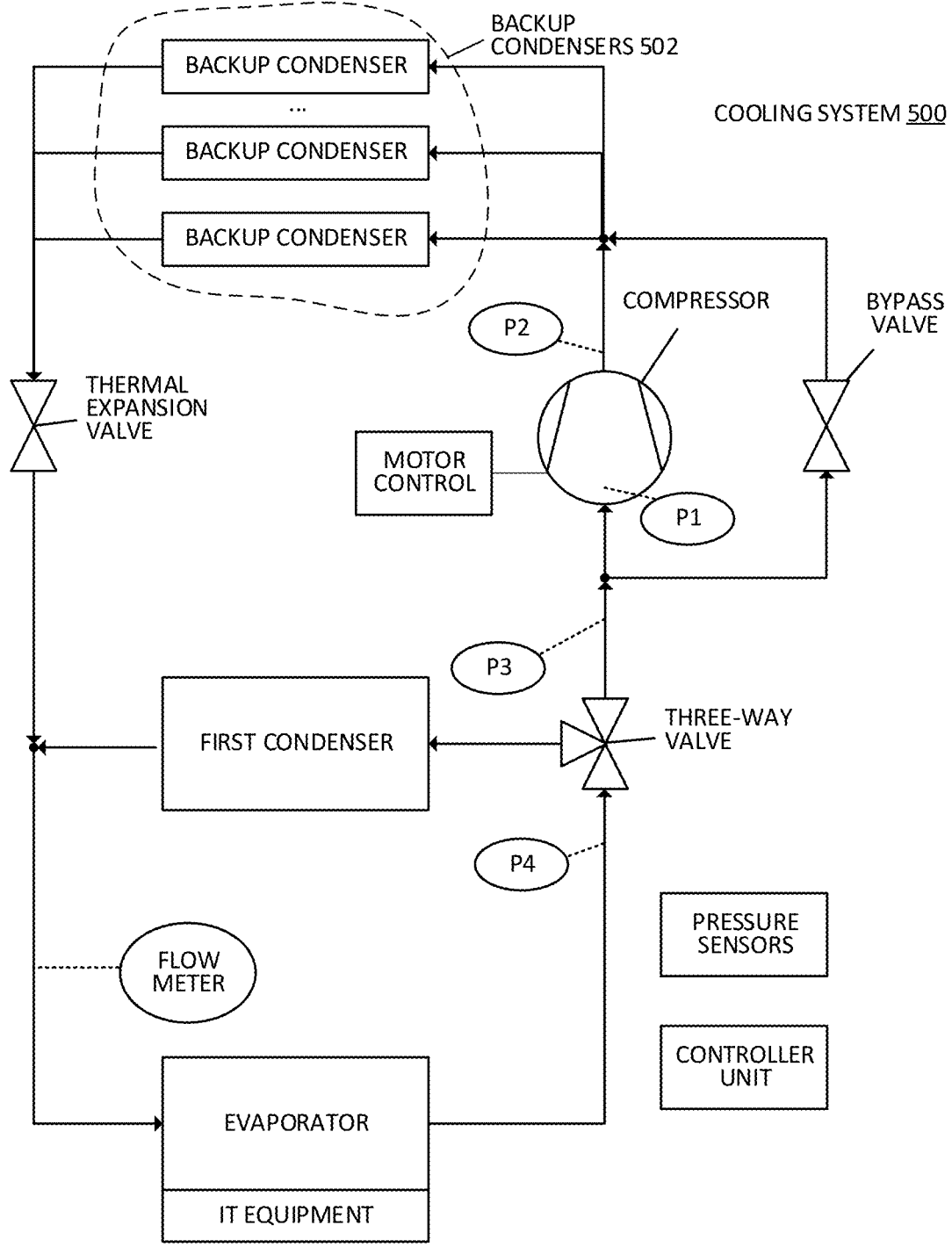
FIG. 5 shows a cooling system with multiple backup condensers, according to one embodiment.

FIG. 2 shows a process 200 for controlling the embodiments of the cooling system described in this disclosure, such as those shown in FIGS. 1, 4 and 5. This process can be performed by a controller unit of the cooling system. The entire system is controlled to work in three modes. The cooling system transitions between the first mode, the second mode, and the third mode automatically, based on pressure at an outlet of the evaporator (shown in FIG. 1 as P4).

In the first mode (passive mode), only the evaporator and the first condenser are active (the passive loop). The cooling system, at operation 202, transitions into the first mode when the pressure at the outlet of the evaporator ($P_4$) is below a first pressure threshold $P_{th1}$. Based on that condition, the process continues to operation 204 where the cooling system runs passive mode. One or more valves of the cooling system (e.g., a three-way valve) are adjusted to circulate fluid through only the evaporator and the first condenser. No pressure difference is present over the thermal expansion valve. The vapor is cooled through the condenser without going through the compressor nor the second condenser of the cooling system. As described, the force to drive fluid moving is gravity and buoyancy force. The physical mechanism is a thermosiphon.

In the transition mode, the vapor is cooled through both the first and second condensers but the compressor is by-passed and left off. The second condenser operates to supplement the first condenser, in a passive manner. At operation 206, the cooling system transitions into the second mode when the pressure at the outlet of the evaporator is above the first pressure threshold $P_{th1}$ and below a second pressure threshold $P_{th2}$. Based on that condition, at process continues to operation 208 where the cooling system runs in transition mode. The one or more valves are adjusted to circulate fluid in both a) the evaporator and first condenser (passive loop), and b) the evaporator and second condenser (transition loop). The transition loop also includes the thermal expansion valve, but in the transition mode, the thermal expansion valve does not release pressure.

In the extreme mode, the fluid, which is mostly or completely in vapor form, is cooled partially by the condenser and partially through the vapor compression loop (the extreme loop) that includes the evaporator, the compressor, the second condenser, and the thermal expansion valve. At operation 210, the cooling system transitions into the third mode when the pressure at the outlet of the evaporator (P4) is above the second pressure threshold $P_{th2}$. Based on that condition, the process continues to operation 212 where the cooling system runs in extreme mode. The one or more valves are adjusted, e.g., by closing the bypass valve while keeping maintaining fluid connectivity between the evaporator and the compressor, to coordinate fluid circulation between a) the evaporator and the first condenser (the passive loop), and c) the evaporator, compressor, and second condenser (the extreme loop). Pressure drops across the thermal expansion valve. This third loop forms a chiller, thereby extracting large quantities of thermal energy from the heat source when required.

When in the extreme mode, operation 216 can check whether there is excessive vapor entering the inlet of the evaporator. As discussed in relation to FIG. 1, a flow meter can take measurements used to determine how much of the fluid at the inlet of the evaporator is in vapor form. If the vapor is greater than a threshold amount, e.g., >10%, the process can proceed to operation 214 to adjust the one or more valves (e.g., the three-way valve) to direct more vapor to the compressor. This will further increase the total thermal transfer of the system, extracting more thermal energy from the fluid at the second condenser, resulting in less vapor at the inlet of the evaporator.

As discussed, pressure is used for controlling the valves open status as well as the open ratio (e.g., 50%, 75%, etc.), and the on/off state of the compressor. The on/off state of the compressor is limited to the third mode (extreme mode) to ensure that only vapor enters the compressor to protect the compressor from liquid-form fluid which can damage the compressor, and at the same time, minimize the compressor use for improved efficiency and shelf-life. The compressor is thus operated in a healthy manner.

When the pressure out the outlet of the evaporator (P4) is below $P_{th1}$ (first mode), this indicates that the heat source under the evaporator generates low heat so that both vapor and liquid exist before the three-way valve and vapor can fully condense in the first condenser. In other words, based on this pressure, the passive loop is sufficient to transfer thermal energy away from the heat source. In some embodiments, $P_{th1}$ is 15 psi. In some embodiments, $P_{th2}$ is 130 psi. It should be understood, however, that the threshold can vary based on application such as, for example, the type of fluid used and the phase change temperature of such a fluid. Such thresholds can be determined through test and experimentation.

When $P_4$ is greater than $P_{th1}$ but less than $P_{th2}$ (the second mode), this indicates that heat generation of the heat source is at an intermediate level, and both the first condenser and the second condenser are needed to condense the vapor. Thus, the system can utilize multiple condensers in the second mode to adjust for higher heat loads, but still remain passive.

When $P_4$ is greater than $P_{th2}$ (the third mode) this indicates that the heat generation of the heat source is high. This situation includes when coolant is completely vaporized (100%) at the outlet of the evaporator. The extreme mode becomes active under this condition and the compressor provides additional cooling capacity.

Figure 3:
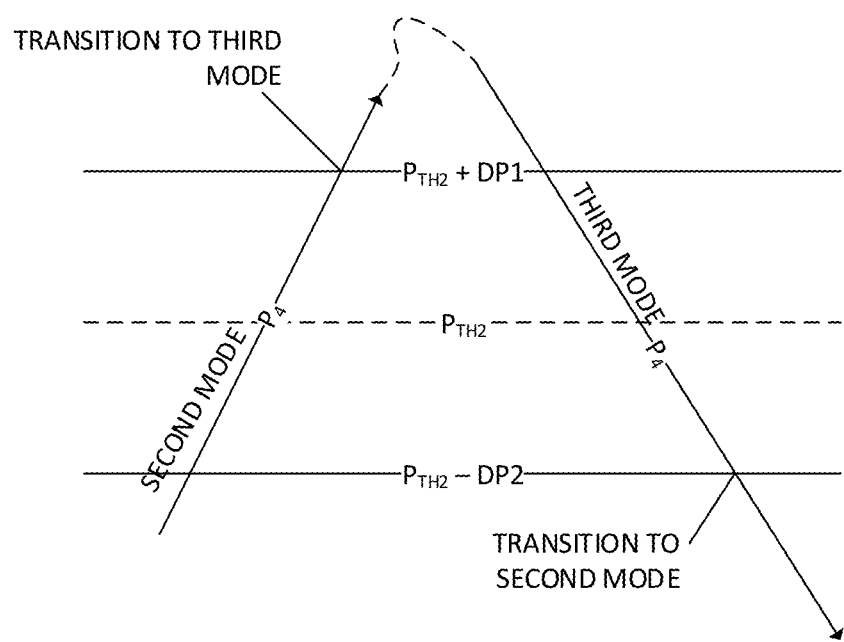
FIG. 3 shows a switching buffer, according to one embodiment.

FIG. 3 shows switching (transitioning) cut-offs are defined with buffers around a pressure threshold to ensure the compressor operates without excessive start and stop cycles. Buffers DP1 (a first predefined amount of pressure) and DP2 (a second predefined amount of pressure) can be defined relative to $P_{th2}$. When the pressure P4 is larger than $P_{th2}$, it must continue to $P_{th2}$+DP1 in order for the controller to consider P4 as larger than $P_{th2}$. As described, when this happens, the controller can transition the cooling system to third mode. Similarly, when the pressure is lower than $P_{th2}$, it must continue until it is under $P_{th2}$+DP2. When that happens, the controller can transition the cooling system out of the third mode, e.g., into the second mode.

It should be understood that, although FIG. 1 shows the one or more valves 106 to include a three-way valve 112 and a bypass valve 118 to coordinate fluid circulation in the first, second, and third modes, other arrangements of controllable valves can be implemented, as shown in FIG. 4. For example, in FIG. 4, a cooling system 400 includes one or more valves 402, which can include a three valves. A valve 404 controls fluid connectivity in the passive loop. Being that in all three modes, the passive loop can remain open, in some embodiments, the valve 404 is not present, and instead, the fluid line is always connected to between the evaporator and the condenser. Another valve 408 bypasses the compressor to control fluid connectivity to the transition loop. Another valve 406 controls fluid connectivity in the extreme loop. In the second mode, the bypass valve 408 can be open while valve 406 is closed. In the third mode, the bypass valve 408 can be closed, and valve 406 can be opened. As discussed, the compressor valve 406 can be adjusted based on how much vapor is flowing back to the evaporator.

Other arrangements of one or more valves can also be implemented and coordinated to control a cooling system to operate in the modes described in the present disclosure. All aspects described with respect to the other embodiments of the cooling system, e.g., those described with respect to FIGS. 1-3 and 5-6, also apply to FIG. 4, other than a particular three-way valve arrangement.

In addition, referring to FIG. 5, a cooling system 500 has multiple backup condensers 502, in place of the second condenser. In other words, the second condenser includes a plurality of condensers. These condensers can share a single bypass valve, as shown. All other aspects described with respect to the other embodiments of the cooling system, e.g., those described with respect to FIGS. 1-4 and 6, also apply to FIG. 5. Thus, in the second mode, multiple secondary condensers can be implemented, in parallel.

Figure 6:
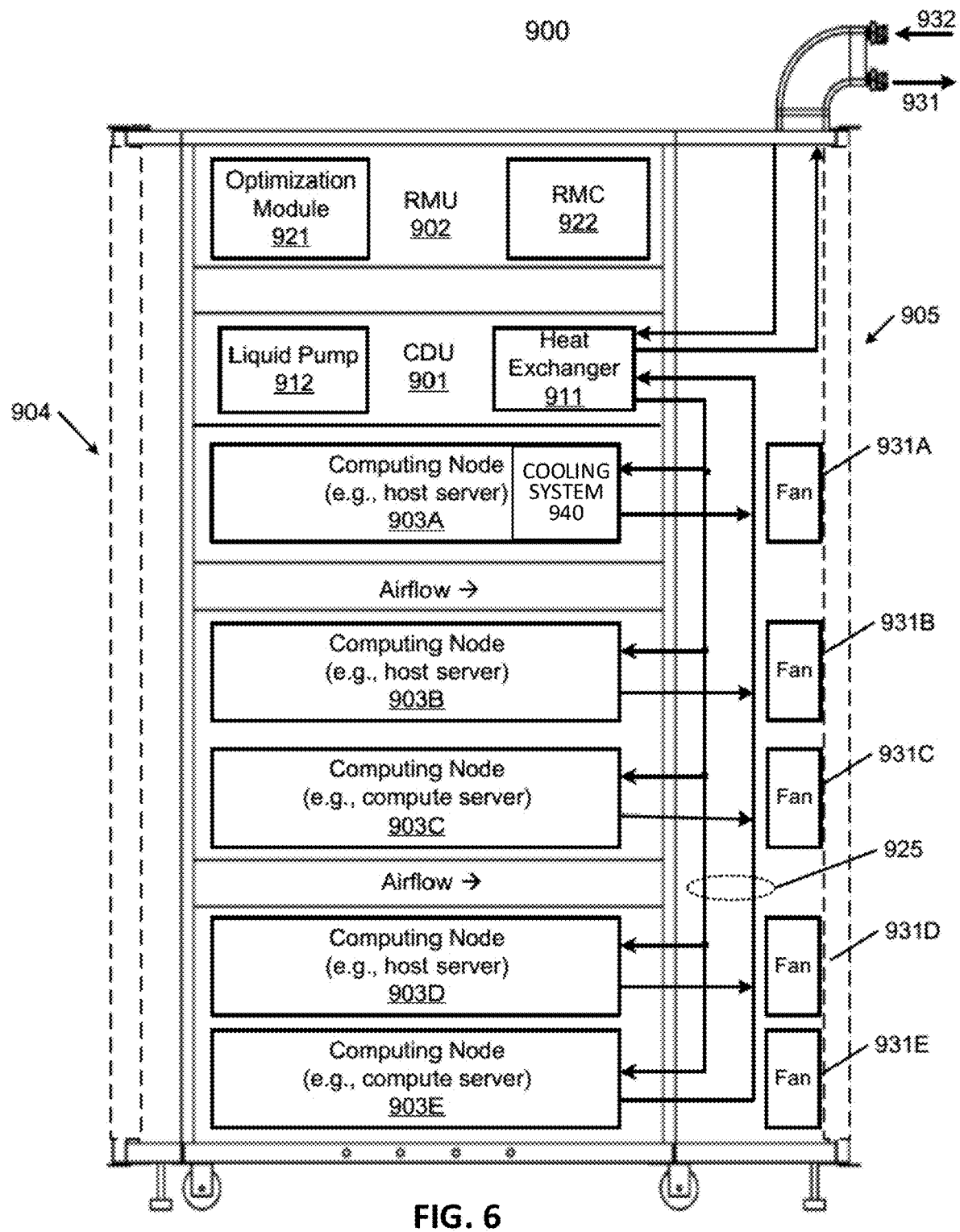
FIG. 6 shows an electronic shelf rack, according to one embodiment.

As described, the cooling system as described in the embodiments above, can be thermally connected to a heat source (e.g., a GPU, CPU, or other IT equipment). The IT equipment can be housed on an electronic rack. FIG. 6 is a block diagram illustrating an example of an electronic rack using a cooling system 940, which can be any of the cooling system embodiments described above. Electronic rack 900 may contain one or more servers, each server having one or more processing units attached to a bottom of any of the cooling systems (e.g., cooling system 940) described above. Referring to FIG. 6, according to one embodiment, electronic rack 900 includes, but is not limited to, CDU 901, rack management unit (RMU) 902 (optional), and one or more server blades 903A-903D (collectively referred to as server blades 903). Server blades 903 can be inserted into an array of server slots respectively from frontend 904 or backend 905 of electronic rack 900. Note that although there are only five server blades 903A-903E shown here, more or fewer server blades may be maintained within electronic rack 900. Also note that the particular positions of CDU 901, RMU 902, and server blades 903 are shown for the purpose of illustration only; other arrangements or configurations of CDU 901, RMU 902, and server blades 903 may also be implemented. Note that electronic rack 900 can be either open to the environment or partially contained by a rack container, as long as the cooling fans can generate airflows from the frontend to the backend.

In addition, for each of the server blades 903, a fan module is associated with the server blade. In this embodiment, fan modules 931A-931E, collectively referred to as fan modules 931, and are associated with server blades 903A-903E respectively. Each of the fan modules 931 includes one or more cooling fans. Fan modules 931 may be mounted on the backends of server blades 903 to generate airflows flowing from frontend 904, traveling through the air space of the sever blades 903, and existing at backend 905 of electronic rack 900.

In one embodiment, CDU 901 mainly includes heat exchanger 911, liquid pump 912, and a pump controller (not shown), and some other components such as a liquid reservoir, a power supply, monitoring sensors and so on. Heat exchanger 911 may be a liquid-to-liquid heat exchanger. Heat exchanger 911 includes a first loop with inlet and outlet ports having a first pair of liquid connectors coupled to external liquid supply/return lines 931-932 to form a primary loop. The connectors coupled to the external liquid supply/return lines 931-932 may be disposed or mounted on backend 905 of electronic rack 900. The liquid supply/return lines 931-932 are coupled to a set of room manifolds, which are coupled to an external heat removal system, or extremal cooling loop. In addition, heat exchanger 911 further includes a second loop with two ports having a second pair of liquid connectors coupled to liquid manifold 925 to form a secondary loop, which may include a supply manifold to supply cooling liquid to server blades 903 and a return manifold to return warmer liquid back to CDU 901. Note that CDUs 901 can be any kind of CDUs commercially available or customized ones. Thus, the details of CDUs 901 will not be described herein.

Each of server blades 903 may include one or more IT components (e.g., central processing units or CPUs, graphical processing units (GPUs), memory, and/or storage devices). Each IT component may perform data processing tasks, where the IT component may include software installed in a storage device, loaded into the memory, and executed by one or more processors to perform the data processing tasks. At least some of these IT components may be attached to the bottom of any of the cooling system as described above. Server blades 903 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

Electronic rack 900 further includes optional RMU 902 configured to provide and manage power supplied to servers 903, fan modules 931, and CDU 901. RMU 902 may be coupled to a power supply unit (not shown) to manage the power consumption of the power supply unit. The power supply unit may include the necessary circuitry (e.g., an alternating current (AC) to direct current (DC) or DC to DC power converter, backup battery, transformer, or regulator, etc.) to provide power to the rest of the components of electronic rack 900.

In one embodiment, RMU 902 includes optimization module 921 and rack management controller (RMC) 922. RMC 922 may include a monitor to monitor operating status of various components within electronic rack 900, such as, for example, computing nodes 903, CDU 901, and fan modules 931. Specifically, the monitor receives operating data from various sensors representing the operating environments of electronic rack 900. For example, the monitor may receive operating data representing temperatures of the processors, cooling liquid, and airflows, which may be captured and collected via various temperature sensors. The monitor may also receive data representing the fan power and pump power generated by the fan modules 931 and liquid pump 912, which may be proportional to their respective speeds. These operating data are referred to as real-time operating data. Note that the monitor may be implemented as a separate module within RMU 902.

Based on the operating data, optimization module 921 performs an optimization using a predetermined optimization function or optimization model to derive a set of optimal fan speeds for fan modules 931 and an optimal pump speed for liquid pump 912, such that the total power consumption of liquid pump 912 and fan modules 931 reaches minimum, while the operating data associated with liquid pump 912 and cooling fans of fan modules 931 are within their respective designed specifications. Once the optimal pump speed and optimal fan speeds have been determined, RMC 922 configures liquid pump 912 and cooling fans of fan modules 931 based on the optimal pump speed and fan speeds.

As an example, based on the optimal pump speed, RMC 922 communicates with a pump controller of CDU 901 to control the speed of liquid pump 912, which in turn controls a liquid flow rate of cooling liquid supplied to the liquid manifold 925 to be distributed to at least some of server blades 903. Therefore, the operating condition and the corresponding cooling device performance is adjusted. Similarly, based on the optimal fan speeds, RMC 922 communicates with each of the fan modules 931 to control the speed of each cooling fan of the fan modules 931, which in turn control the airflow rates of the fan modules 931. Note that each of fan modules 931 may be individually controlled with its specific optimal fan speed, and different fan modules and/or different cooling fans within the same fan module may have different optimal fan speeds.

Note that some or all of the IT components of servers 903 may be attached to any one of the cooling systems described above, e.g., at the evaporator of the cooling system. One server may utilize air cooling while another server may utilize liquid cooling. Alternatively, one IT component of a server may utilize air cooling while another IT component of the same server may utilize liquid cooling.

It should be understood that the various features shown with respect to one figure can also be present in other embodiments of different feature.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A cooling system, comprising:
   an evaporator, connected through fluid lines to a first condenser, a second condenser, a compressor, and a thermal expansion valve; and
   one or more valves that are arranged in the fluid lines, the one or more valves operated to
   in a first mode, circulate fluid between the evaporator the first condenser,
   in a second mode, circulate the fluid between a) the evaporator and the first condenser, and b) the evaporator, the second condenser, and the thermal expansion valve, and
   in a third mode, circulate the fluid between a) the evaporator and the first condenser, and c) the evaporator, the compressor, the second condenser, and the thermal expansion valve.

2. The cooling system of claim 1, wherein the cooling system transitions between the first mode, the second mode, and the third mode automatically, based on pressure at an outlet of the evaporator.

3. The cooling system of claim 2, wherein the cooling system transitions into the first mode when the pressure at the outlet of the evaporator is below a first pressure threshold.

4. The cooling system of claim 3, wherein the cooling system transitions into the second mode when the pressure at the outlet of the evaporator is above the first pressure threshold and below a second pressure threshold.

5. The cooling system of claim 4, wherein the cooling system transitions into the third mode when the pressure at the outlet of the evaporator is above the second pressure threshold.

6. The cooling system of claim 4, wherein the cooling system transitions into the third mode when the pressure at the outlet of the evaporator is greater than the second pressure threshold by a first predefined amount, and transitions out of the third mode when the pressure at the outlet of the evaporator is less than the second pressure threshold by a second predefined amount.

7. The cooling system of claim 1, wherein the evaporator and the first condenser form a thermosiphon loop that circulates between the evaporator and the first condenser passively, without use of a motor.

8. The cooling system of claim 1, wherein the compressor is turned on in the third mode and turned off in the first mode and the second mode.

9. The cooling system of claim 1, wherein, in the third mode, pressure is released through the thermal expansion valve creating a pressure drop across the thermal expansion valve, and in the second mode, the pressure across the thermal expansion valve is maintained to be uniform.

10. The cooling system of claim 1, wherein, in the third mode, based on a measurement that indicates an amount of the fluid that is in vapor form at an inlet of the evaporator, the one or more valves are operated to increase fluid circulation from the evaporator to the compressor, and the second condenser.

11. The cooling system of claim 1, wherein the one or more valves includes a three-way valve that is operated to fluidly connect the evaporator to only the first condenser in the first mode.

12. The cooling system of claim 11, wherein the one or more valves includes a bypass valve connected in parallel with the compressor and in series with the second condenser that is operated to
   in the second mode, open and bypass the compressor resulting in fluid circulation from the evaporator to the second condenser, and
   in the third mode, close, resulting in fluid circulation from through the compressor to the second condenser, in the third mode.

13. The cooling system of claim 1, wherein the second condenser consists of a plurality of secondary condensers.

14. The cooling system of claim 1, wherein the compressor is an adjustable compressor, and adjustments of the compressor provide varying cooling capabilities.

15. An electronics rack that houses IT equipment and a cooling system that is thermally coupled to the IT equipment, the cooling system including
    an evaporator, connected through fluid lines to a first condenser, a second condenser, a compressor, and a thermal expansion valve; and
    one or more valves that are arranged in the fluid lines, the one or more valves operated to
        in a first mode, circulate fluid between the evaporator the first condenser,
        in a second mode, circulate the fluid between a) the evaporator and the first condenser, and b) the evaporator, the second condenser, and the thermal expansion valve, and
        in a third mode, circulate the fluid between a) the evaporator and the first condenser, and c) the evaporator, the compressor, the second condenser, and the thermal expansion valve.

16. The electronics rack of claim 15, wherein the cooling system transitions between the first mode, the second mode, and the third mode automatically, based on pressure at an outlet of the evaporator.

17. The electronics rack of claim 16, wherein the cooling system transitions into the first mode when the pressure at the outlet of the evaporator is below a first pressure threshold.

18. The electronics rack of claim 17, wherein the cooling system transitions into the second mode when the pressure at the outlet of the evaporator is above the first pressure threshold and below a second pressure threshold.

19. The electronics rack of claim 18, wherein the cooling system transitions into the third mode when the pressure at the outlet of the evaporator is above the second pressure threshold.

20. The electronics rack of claim 15, wherein the evaporator and the first condenser form a thermosiphon loop that circulates between the evaporator and the first condenser passively, without use of a motor.

* * * * *